United States Patent [19]
Pilling et al.

[11] Patent Number: 5,514,980
[45] Date of Patent: May 7, 1996

[54] HIGH RESOLUTION CIRCUIT AND METHOD FOR SENSING ANTIFUSES

[75] Inventors: David J. Pilling, Los Altos Hills; Raymond M. Chu, Saratoga; Sik K. Lui, Sunnyvale, all of Calif.

[73] Assignee: Integrated Device Technology, Inc., Santa Clara, Calif.

[21] Appl. No.: 456,991

[22] Filed: May 31, 1995

[51] Int. Cl.$^6$ .................................................. H01H 37/76
[52] U.S. Cl. ............................... 326/38; 327/525; 327/51
[58] Field of Search ............................... 326/38, 9, 16; 327/525, 51, 57; 365/225.7

[56] References Cited

U.S. PATENT DOCUMENTS

| | | | |
|---|---|---|---|
| 4,590,388 | 5/1986 | Clemons et al. | 327/525 |
| 4,686,384 | 8/1987 | Harvey et al. | 326/9 |
| 4,730,129 | 3/1988 | Kunitoki et al. | 327/525 |
| 5,345,110 | 9/1994 | Renfro et al. | |
| 5,418,487 | 5/1995 | Armstrong, II | 326/38 |
| 5,424,672 | 6/1995 | Cowles et al. | 326/38 |

OTHER PUBLICATIONS

Neil H. E. Weste et al., *Principles of CMOS VLSI Design* 395–98 (Addison–Wesley Publishing Co., 2d Ed. 1993).

*Primary Examiner*—Edward P. Westin
*Assistant Examiner*—Jon Santamauro
*Attorney, Agent, or Firm*—Skjerven, Morrill, MacPherson, Franklin, & Friel

[57] ABSTRACT

A high resolution sense amplifier and method for sensing the state of antifuses in an integrated circuit is capable of correctly reading even a defectively programmed antifuse having a resistance of up to 20 KΩ as being programmed. The sense amplifier reads two antifuses at each programmable location, and correctly reads that location as being programmed if either or both of the antifuses at that location have been blown.

14 Claims, 1 Drawing Sheet

HIGH RESOLUTION CIRCUIT AND METHOD FOR SENSING ANTIFUSES

FIELD OF THE INVENTION

This invention relates to a sense amplifier circuit and method for sensing whether antifuses in an integrated circuit are in a programmed or an unprogrammed state.

BACKGROUND OF THE INVENTION

Antifuses, which are widely used in integrated circuits, are programmable structures having an extremely high resistance (e.g., greater than 100 MΩ) prior to programming and a low resistance (e.g., 200–400 Ω) after programming. In general terms, a programmed antifuse establishes an electrical connection at a location where an open circuit previously existed. For example, antifuses placed at the locations in a logic array where horizontal and vertical wires intersect may be selectively programmed to make electrical connections only at the desired locations, thereby programming the array logic component to perform a specific function.

Before being programmed, a typical antifuse structure may consist of a dielectric layer between two conducting electrodes. For example, a thin silicon nitride dielectric layer may be sandwiched between two conductors such as an aluminum layer and a diffusion layer.

Such antifuses may be "blown" or programmed by applying a voltage across the two electrodes sufficient to rupture the dielectric layer and create a conductive filament through the dielectric layer to connect the two electrodes. The resistance of the antifuse after programming depends upon various factors. These factors include (a) the particular dielectric material used, such as silicon nitride, silicon dioxide or other thin films, and (b) the voltage and current used to program the antifuse.

If the antifuse is satisfactorily programmed, the antifuse is permanently changed from a high-resistance or "unprogrammed" value (e.g., 100 MΩ) to a low-resistance or "programmed" value (e.g., 200–400 Ω). Unfortunately, the antifuse may not be satisfactorily programmed, but may instead be defectively programmed. For example, normal processing variations may result in the antifuse having a value of 3–5 KΩ rather than the desired 200–400 Ω. If processing control is not properly maintained, the antifuse may have an even higher resistance, for example 10–12 KΩ.

Antifuses are used in various applications, including logic control circuits which are programmed by blowing the antifuses. Sense amplifiers are used to "read" such control circuits by sensing whether the antifuses are in their programmed or unprogrammed state. Defectively programmed antifuses can cause such control circuits (or other types of circuits using the antifuses) to malfunction. For example, a conventional sense amplifier circuit may erroneously read an antifuse which has a resistance of, e.g., 400–800 Ω or higher as being unprogrammed. Under normal processing conditions, only a small percentage of antifuses (e.g., one a thousand) will be defectively programmed. However, if a single antifuse is defective, the entire "die" or chip containing the defective antifuse may have to be discarded. Since the antifuses normally occupy only a very small portion (e.g., 0.1 percent) of the die, this significantly reduces the yield.

SUMMARY OF THE INVENTION

In accordance with the present invention, an improved sense amplifier circuit and method is provided which more reliably senses whether a particular location in a logic array is in a programmed or an unprogrammed state.

As described above, conventional logic arrays typically use only a single antifuse at each programmable location, and a defectively programmed antifuse at a particular location may cause the entire logic circuit to malfunction. In accordance with the present invention, two antifuses are used at each programmable location, and an improved sense amplifier circuit correctly reads that location as being programmed if either or both of the antifuses at that location have been blown. Thus, the logic circuit will malfunction only if both antifuses are defective. As a result, the number of defective die is reduced, for example, by a factor of 1,000 (from 1/1,000 to 1/1,000,000), substantially improving the wafer yield. Moreover, a high resolution sense amplifier in accordance with the present invention is capable of correctly reading even certain defectively programmed antifuses (e.g., antifuses having a resistance of 20 KΩ or lower) as being programmed, in contrast with the low resolution sense amplifiers of the prior art which cannot correctly read antifuses having a resistance of, e.g., higher than 800 Ω. The higher resolution provided by a sense amplifier according to the present invention further increases both the yield and the reliability of the finished die.

DETAILED DESCRIPTION

Figure 1:
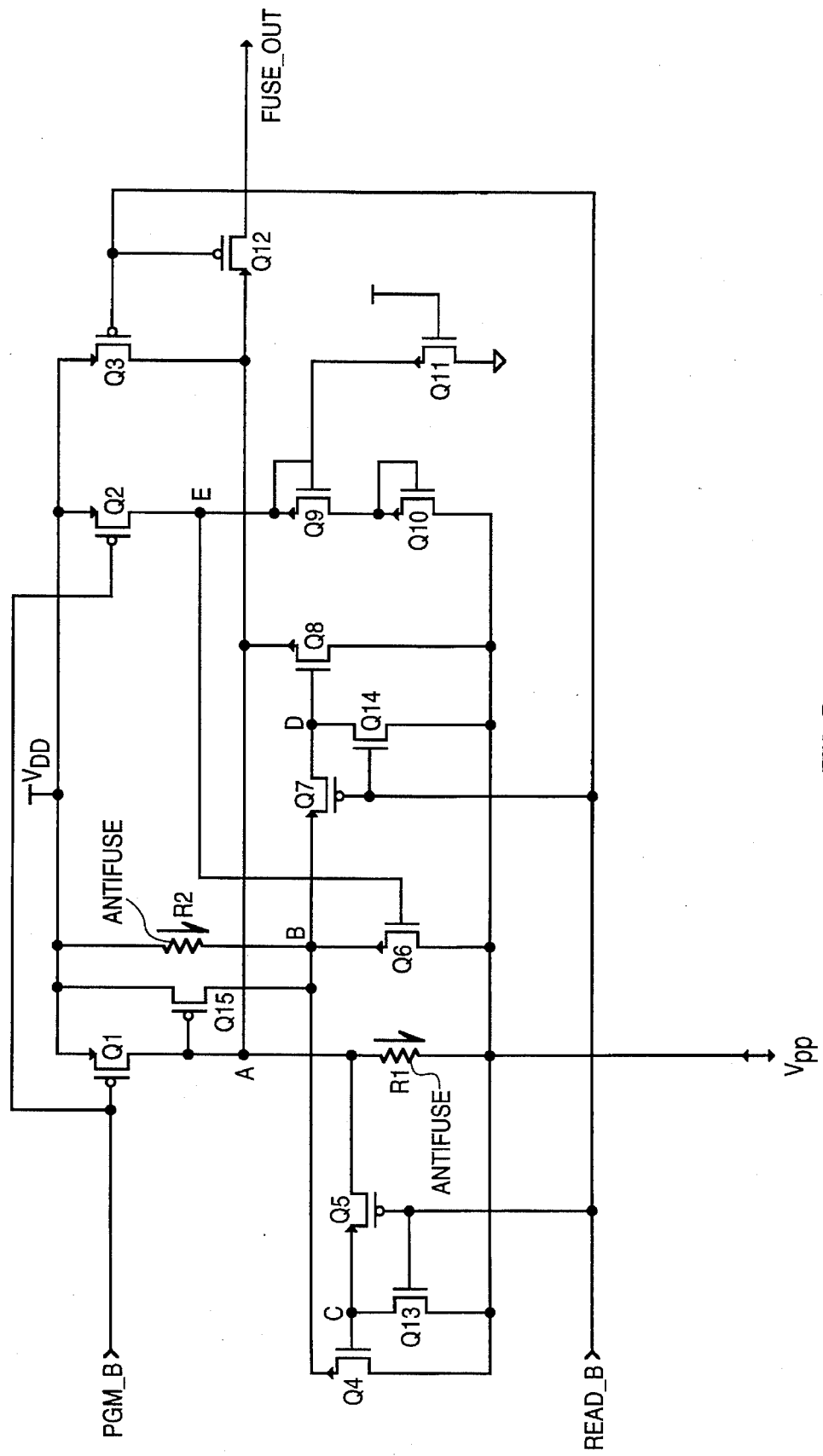
FIG. 1 is a circuit diagram of an improved sense amplifier circuit for sensing antifuses in accordance with this invention.

In a read operation, the circuit of FIG. 1 will produce either a logic 1 or a logic 0 on the output pin FUSE_OUT, depending on whether antifuses R1 and R2 are in their unprogrammed or programmed state. As described below in more detail, if both antifuses R1 and R2 remain unprogrammed (i.e., so that both antifuses have an extremely high resistance), a logic 1 will appear on the output pin FUSE_OUT during the read operation. However, if either or both of antifuses R1 and R2 are programmed (i.e., so that either or both of the antifuses have a low resistance), a logic 0 will be read on the FUSE_OUT pin.

In the normal programming mode, both antifuses R1 and R2 are programmed simultaneously, so that either (a) both antifuses R1 and R2 remain unprogrammed, or (b) both antifuses R1 and R2 are programmed. However, it is possible under certain conditions that one antifuse will remain unprogrammed, while the other antifuse will either be satisfactorily programmed (e.g., to have a resistance of 200–400 Ω) or defectively programmed (e.g., to have a resistance of 20 KΩ). An improved sense amplifier circuit according to the present invention is able to correctly read a particular location as being programmed even if one of the antifuses at that location remains unprogrammed and the other antifuse at that location is defectively programmed so that it has a resistance of, e.g., up to 20 KΩ, thus providing a major advantage over the prior art.

The antifuses R1 and R2 are programmed as follows. The node labelled PGM_B is brought low, turning on PMOS transistor Q1 and raising node A to $V_{DD}$ (e.g., +5 V. relative to system ground). The programming pin $V_{pp}$ (an external pad pin) is brought down to, e.g., −5 V. relative to system ground. Thus, for example, a total voltage of 10 V. is applied across antifuse R1 for a time period of 1–10 msec at a current of 10 mA, which "blows" antifuse R1 (i.e., programs antifuse R1 to have a low resistance of, for example, 200–400 Ω). At the same time, the low voltage on PGM_B turns PMOS transistor Q2 on. The current through PMOS transistor Q2 creates a voltage drop across transistor diodes Q9 and Q10, and the resulting potential at node E turns NMOS transistor Q6 on. Transistor Q6 brings the terminal of antifuse R2 at node B down to programming pin $V_{pp}$'s potential (e.g., −5 V. relative to system ground). Since the other terminal of antifuse R2 is at $V_{DD}$, a total voltage of 10 V. also appears across antifuse R2 and blows antifuse R2. During the programming cycle, pin READ_B is brought high, turning off PMOS transistors Q5 and Q7, and thus isolating the NMOS transistors Q4 and Q8 from the programming voltage. The high voltage on pin READ_B turns transistors Q13 and Q14 on, thereby ensuring that transistors Q4 and Q8 are turned off so that the programming current is not dissipated through transistors Q4 and Q8.

When the circuit of FIG. 1 is not in the programming mode, PGM_B is high so that transistors Q1 and Q2 are turned off, allowing the high impedance NMOS transistor Q11 to discharge node E. This turns transistor Q6 off.

Prior to the read cycle, pin READ_B is high, turning on NMOS transistors Q13 and Q14 and discharging nodes C and D to $V_{ss}$ (system ground). This insures that transistors Q4 and Q8 are turned off.

To begin the read cycle, pin READ_B is brought low, turning NMOS transistors Q13 and Q14 off and PMOS transistors Q5 and Q7 on. This allows node C to assume the potential of node A and allows node D to assume the potential of node B, effectively cross-coupling transistors Q4 and QS. PMOS transistor Q15 provides feedback which enhances the cross-coupled gain of the circuit. The programming pin $V_{pp}$ is held at $V_{ss}$. PMOS transistor Q3 is turned on, supplying current to node A. PMOS transistor Q12 is also turned on, allowing the logic level on node A to be transferred to the output pin FUSE_OUT.

The result of the read operation depends on the programming states of antifuses R1 and R2:

a. If neither antifuse R1 nor antifuse R2 is programmed, so that neither antifuse conducts current as a resistor, transistor Q3 brings node A high. This turns feedback transistor Q15 off and turns transistor Q4 on, forcing node B low. Transistor Q8 remains off. The logic 1 on node A is transferred to the output pin FUSE_OUT by transistor Q12 and read on pin FUSE_OUT.

b. If both of the antifuses R1 and R2 are programmed, so that both antifuses conduct as resistors, antifuse R1 pulls node A toward $V_{ss}$, turning feedback transistor Q15 on. Together, transistor Q15 and antifuse R2 pull node B and thus node D up to $V_{DD}$. As node D pulls up, it increases the drive on transistor QS, pulling node A low and turning transistor Q4 off. (Although transistor Q3 is also turned on, transistor Q8 has a larger drive than transistor Q3 and overcomes the tendency of transistor Q3 to pull node A toward $V_{DD}$.) The logic 0 on node A is transferred to the output pin FUSE_OUT by transistor Q12 and read on pin FUSE_OUT.

c. If antifuse R1 is programmed so that it conducts and antifuse R2 is not programmed so that it does not conduct, antifuse R1 pulls node A toward $V_{ss}$, turning feedback transistor Q15 on. Transistor Q15 pulls node B and node D toward $V_{DD}$. As node D pulls up, it increases the drive on transistor Q8, pulling node A low and turning transistor Q4 off. The logic 0 on node A is transferred to the output pin FUSE_OUT by transistor Q12 and read on pin FUSE_OUT.

d. If antifuse R1 is not programmed so that it does not conduct and antifuse R2 is programmed so that it conducts, the relatively small current through transistor Q3 will initially pull node A toward $V_{DD}$. Node B will also be pulled toward $V_{DD}$ by the slightly larger current through R2. Due to the cross-coupling between transistors Q4 and Q8, nodes A and B cannot both remain high. The conflict between nodes A and B is resolved by the current supplied by the antifuse R2 across the impedance of transistor Q4 being greater than the current supplied by the transistor Q3 across the impedance of transistor QS, so that node B rises faster than node A. Transistor Q8 turns on slightly, starting to pull the gate of transistor Q15 down. Transistor Q15 quickly pulls node B up strongly toward $V_{DD}$. Transistor Q8 is then turned on strongly, pulling node A harder toward $V_{ss}$. Transistor Q4 is turned off when node A drops below the threshold voltage of transistor Q4, so that node B remains high. The logic 0 on node A is transferred to the output pin FUSE_OUT by transistor Q12 and read on pin FUSE_OUT.

The above description is intended to be illustrative and not restrictive. Many variations of the invention will become apparent to those of skill in the art upon review of this disclosure. Merely by way of example, while the sense amplifier circuit of FIG. 1 is intended to be implemented in a p-well process, it will be apparent to those of skill in the art that a reciprocal of the sense amplifier circuit (in which PMOS devices are substituted for the NMOS devices of FIG. 1, and vice versa) may be implemented in an n-well process. The scope of this invention should, therefore, be determined with reference to the appended claims along with their full scope of equivalents.

What is claimed is:

1. A sense amplifier for sensing the state of first and second antifuses, comprising:

a first node capable of being coupled through the first antifuse to ground, and further capable of being coupled to an output pin to thereby provide an output signal on the output pin;

a second node capable of being coupled through the second antifuse to a supply voltage;

a sensing circuit for providing at the first node a first output signal of a first logic type if neither of the antifuses is programmed, and for providing at the first node a second output signal of a second logic type if either or both of the antifuses are programmed; and a third node for receiving an activating signal for activating the sense amplifier to sense the state of the first and second antifuses.

2. A sense amplifier as in claim 1 wherein the sensing circuit comprises:

a first transistor of a first conductivity type, having a drain coupled to the first node, a source coupled to ground, and a gate;

a second transistor of the first conductivity type, having a drain coupled to the second node, a source coupled to ground, and a gate;

wherein activating the sense amplifier cross-couples the first and second transistors by causing the gate of the first transistor to be coupled to the drain of the second transistor, and the gate of the second transistor to be coupled to the drain of the first transistor;

a third transistor of a second conductivity type, having a source capable of being coupled to the supply voltage, a drain coupled to the first node, and a gate coupled to the third node; and a fourth transistor of the second conductivity type, having a source capable of being coupled to the supply voltage, a drain coupled to the second node, and a gate coupled to the first node, the fourth transistor increasing the feedback between the cross-coupled first and second transistors.

3. A sense amplifier as in claim 2 wherein the sensing circuit further comprises a fifth transistor for coupling the first node to the output pin when the sense amplifier is activated.

4. A sense amplifier as in claim 3 wherein the sensing circuit further comprises sixth and seventh transistors and for ensuring that the first and second transistors are turned off while antifuses R1 and R2 are being programmed.

5. A sense amplifier as in claim 4 wherein the sensing circuit further comprises eighth and ninth transistors and for isolating the first and second transistors from the programming voltage while antifuses R1 and R2 are being programmed.

6. A sense amplifier as in claim 1 wherein the sense amplifier is capable of sensing antifuse R1 as being programmed if antifuse R1 has a resistance of 20 K$\Omega$ or less.

7. A sense amplifier as in claim 1 wherein the sense amplifier is capable of sensing antifuse R2 as being programmed if antifuse R2 has a resistance of 20 K$\Omega$ or less.

8. A method for sensing the state of first and second antifuses with a sense amplifier, comprising:

providing a sensing circuit having first and second nodes, the sensing circuit furnishing at the first node a first output signal of a first logic type if neither of the antifuses is programmed, and furnishing at the first node a second output signal of a second logic type if either or both of the antifuses are programmed;

coupling the first antifuse between the first node and ground, and further coupling the first node to an output pin to thereby provide an output signal on the output pin;

coupling the second antifuse between the second node and a supply voltage; and activating the sense amplifier to sense the state of the first and second antifuses.

9. A method as in claim 8 wherein the sensing circuit comprises:

a first transistor of a first conductivity type, having a drain coupled to the first node, a source coupled to ground, and a gate;

a second transistor of the first conductivity type, having a drain coupled to the second node, a source coupled to ground, and a gate, wherein the first and second transistors are cross-coupled;

a third transistor of a second conductivity type, having a source capable of being coupled to the supply voltage, a drain coupled to the first node, and a gate coupled to the third node; and a fourth transistor of the second conductivity type, having a source capable of being coupled to the supply voltage, a drain coupled to the second node, and a gate coupled to the first node, the fourth transistor increasing the feedback between the cross-coupled first and second transistors.

10. A method as in claim 9 further comprising: providing a fifth transistor for coupling the first node to the output pin when the sense amplifier is activated.

11. A method as in claim 10 further comprising providing sixth and seventh transistors and for ensuring that the first and second transistors are turned off while antifuses R1 and R2 are being programmed.

12. A method as in claim 11 further comprising providing eighth and ninth transistors and for isolating the first and second transistors from the programming voltage while antifuses R1 and R2 are being programmed.

13. A method as in claim 8 wherein the sense amplifier is capable of sensing antifuse R1 as being programmed if antifuse R1 has a resistance of 20 K$\Omega$ or less.

14. A method as in claim 8 wherein the sense amplifier is capable of sensing antifuse R2 as being programmed if antifuse R2 has a resistance of 20 K$\Omega$ or less.

\* \* \* \* \*